United States Patent [19]

Olds et al.

[11] Patent Number: 4,963,237

[45] Date of Patent: Oct. 16, 1990

[54] METHOD FOR ELECTROCHEMICAL ACTIVATION OF IVD ALUMINUM COATINGS

[76] Inventors: Robert S. Olds, 11816 Sprucehaven, St. Louis, Mo. 64146; Kenny Murphy, 215 Hutchinson, Ellisville, Mo. 63011

[21] Appl. No.: 350,635

[22] Filed: May 8, 1989

[51] Int. Cl.$^5$ .................. C23C 14/16; C23C 14/32
[52] U.S. Cl. .................................................. 204/192.31
[58] Field of Search ............ 204/192.31, 192.15; 427/250; 428/649, 653

[56] References Cited

U.S. PATENT DOCUMENTS 2,935,421  5/1960  Chisholm ............. 428/649 XR
2,982,016  5/1961  Drummond ........... 428/649 XR
3,475,140  10/1969  Russell ................. 428/649

OTHER PUBLICATIONS

A. W. Morris, Plating & Surface Finishing, vol. 63, No. 10, pp. 42–46 (1976).

D. G. Teer et al., Thin Solid Films, 72, pp. 291–296, (1980).

H. Sundquist et al., Thin Solid Films, 73, pp. 309–314, (1980).

*Primary Examiner*—G. L. Kaplan
*Attorney, Agent, or Firm*—Veo Peoples, Jr.

[57] ABSTRACT

More effective electrochemical activation of IVD aluminum coatings, stable against the formation of passive oxide films, is made possible by ionic vapor deposition of metal-coated or alloyed aluminum or magnesium wire onto steel or aluminum substrates.

4 Claims, No Drawings

4,963,237

METHOD FOR ELECTROCHEMICAL ACTIVATION OF IVD ALUMINUM COATINGS

BACKGROUND OF THE INVENTION

The present invention relates to ion vapor deposition of (IVD) aluminum or magnesium onto steel/aluminum alloy. More particularly, this invention relates to an improved sacrificial galvanic protection for steel in mild environments such as inland, rural and mild industrial atmospheres.

In the past, ion vapor deposited aluminum has been used to provide sacrificial galvanic protection to steel and aluminum in severe environments, such as marine or heavy industrial atmospheres. However, when steel structures having ion vapor deposited aluminum coatings are exposed to milder environments, such as inland, rural, and mild industrial atmospheres, the aluminum coating forms an oxide film which is unduly passive and suppresses galvanic activity. This is particularly true when steel is used in the landing gear and critical structural components of aircraft and/or rocket motor cases.

Sacrificial galvanic protection has also been employed on offshore steel structures. Several mechanisms have been proposed for such galvanic activity.

One such proposed activation mechanism for these aluminum anodes involves alloying zinc, indium, tin and/or mercury with aluminum. The zinc, indium, or tin will locally separate the aluminum oxide film. These alloying elements are customarily used in aluminum cathodic protection anodes for sea-going structures. They have not been used as corrosion protection coatings up to now. A proposed mechanism for the effect of these alloying elements is described in an article entitled "A Proposed Activation Mechanism For Aluminum Anodes" by M. C. Reboul, et. al. published in *Corrosion Magazine*, Volume 40, No. 7 (July 1984), pages 366-371.

Another mechanism consists of an impressed direct current between the offshore steel structures and particular anodes made from the aluminum and the above described alloys. The current polarizes the structures, shifting their potential.

However, attempts to adapt these mechanisms to ion vapor deposition have heretofore been untried. For example, it is technologically prohibitive to apply anodes generating galvanic current on the surface of aircraft and/or rocket components, and little is known as to whether it would be effective to vapor plate multiple metallic components over a steel substrate so as to provide galvanic activity.

Of all the metal coating processes, ion vapor deposition is commonly considered the process providing the most secure bonding mechanism between metal substrates and the metal coating. The bond is characterized by relatively deep difusion between the molecules of the two metals at the interface between those metals. The effectiveness of the bond to a large measure derives from the ability to thoroughly clean the substrate as an adjunct of the ion vapor deposition process and to deposit the metal coating in a powerful ion bombardment. A trough-like boat is employed as an evaporator unit to receive the coating metal, and a temperature control mechanism for heating the boat sufficiently to melt and evaporate the coating metal, is commonly employed both of which are located within a vacuum chamber of the ion vapor deposition devices.

Owing to the wide variation between the melting and vapor points of aluminum as compared to the melting and vapor points of other metals which are anodic to steel such as zinc and indium, or nonanodic metals such as tin, separate auxilliary evaporation boats with independent temperature controls were believed necessary to ion vapor deposit aluminum with the other alloying elements.

That is to say, aluminum melts at approximately 660 degrees C. and vaporizes at approximately 2,467 degrees C., while zinc melts at only 419 degrees C. and vaporizes at but 907 degrees C. All the same, indium melts at only 156 degrees C., while it takes a temperature of 2,080 degrees C. before it vaporizes. Tin, likewise, melts at a relatively low temperature of 232 degrees C., while not vaporizing until 2,270 degrees C.

However, we have discovered that the "shields" employed in IVD processes can prevent cross-contamination between the independent boats, actually lowers the coating efficiency, because the evaporants condense on the surface of the shields. Accordingly, it did not appear possible to produce a galvanically active alloyed IVD aluminum coating.

Accordingly, a method for electrochemical activation of IVD aluminum coatings that would remain stable against the formation of passive oxides in mild environments has here-to-fore, not been possible. An effective method, which would overcome the drawbacks previously encountered, would represent a substantial advancement in the art.

SUMMARY OF THE INVENTION

It is a principle object of the present invention to provide an electrochemically active IVD aluminum coating for steel which retards or prevents formation of passive oxide coatings in mild environments.

It is an additional object of the present invention to provide a new and novel activating mechanism for aluminum using alloying elements deposited by IVD without concern for cross-contamination during vaporization and yet having a high coating efficiency.

It is a further object of the present invention to provide a new and novel method for improved activation of an ion vapor deposited aluminum coating on steel which employs alloying elements without the need for undue modification of ion vapor deposition equipment.

These objects and others, which will become more apparent from the following Detailed Description of the Preferred Embodiments and from the Examples, are fulfilled by zinc-plating aluminum wire feedstock and the subsequent ion vapor deposition of that feedstock onto steel substrates.

DETAILED DESCRIPTION OF THE PREFERRED EMBODIMENTS

In the process of the present invention, pure aluminum wire of the type ordinarily used as a feedstock for IVD machinery is replaced by metal plated aluminum wire and also alloy aluminum. Preferably, the metal plated or alloy aluminum wire feedstock has any convenient diameter of about 0.0625 inches and is employed in sections having a length of up to about 500 feet.

It is a preferred embodiment of the present ivention zinc plated aluminum wire, particularly if combined with tin, is employed. That is to say, thinner coatings have been found to achieve better performance in corrosion resistance test under mild atmospheric conditions, provided that they have a relatively small percentage of tin relative to the amount of zinc present in the alloy.

It is critical that the alloy wire be ductile enough to feed easily through the wire feed mechanism of the chamber. When desired to have at least 2% zinc in the coating, it is preferred to plate the zinc onto aluminum because zinc-aluminum alloy wires of that composition are too brittle.

A synergistic amount of tin as a weight to weight ratio of tin to zinc will range from about 0.01 to 0.3. A particularly preferred alloy for the metal plated aluminum wire will comprise 90–94% by weight aluminum, 6–10 weight percent zinc, and approximately 0.1–4.0 percent tin, by weight.

The plated aluminum feedstock is then fed into conventional ion vapor deposition (IVD) machinery. Such machines are known, for example, from U.S. Pat. Nos. 3,750,623 and 3,926,147 and 4,116,161 and 4,233,937. It is important to note, however, that depositing the alloying elements, such aluminum, zinc, and tin from individual, independent evaporating boats results in inferior control over the chemical composition of the coating, and nonuniform thickness, and/or extensive modification of the machinery.

It appeared unjustified to try to achieve the requisite galvanic activation of aluminum via IVD. Suprisingly, however, the process of the present invention unexpectedly overcomes these problems. Particularly, we have found that even when zinc-plating constitutes 5% of the total cross sectional area of the feedwire, and without attempting to compensate for the variation in density or atomic weight of the aluminum and zinc, there is sufficient transfer efficiency (percentage of zinc evaporated which was actually incorporated into the deposited coating).

Production scale IVD chambers provide even more enhanced composition control and transfer efficiency than is reflected in the examples because production scale chambers are designed for better uniformity of coating thickness. The transfer efficiency can be increased by a greater potential difference between the evaporation source and the substrate. It is particularly preferred to maintain the walls of the chamber and the other components of the composition below the melting point of the plating metal, such as zinc. The stainless steel structures of the IVD chamber can be damaged from contact with zinc at above its 419 degree centigrade melting point. Nevertheless, we have found, even with laboratory scale IVD chambers, from about 36 to 45% of the amount of zinc evaporated is effectively incorporated into the deposited coating. This occurs despite the fact that zinc has a much lower melting point (419 degrees centigrade vs. 660 degrees centigrade) and a much lower condensation temperature (907 degrees vs. 2,467 centigrade) than does aluminum and despite having to maintain the temperatures of the equipment and the components below the melting point of zinc.

In another embodiment of the invention aluminum may be alloyed with 10 to 20% Magnesium. Magnesium may also be applied by IVD to aluminum parts. Magnesium can also be IVD coated onto steel, preferably low alloy high strength steel. However, there is the risk of hydrogen embrittlement because of the high galvanic potential developed, i.e. about 1.9 volts. The following examples are intended to illustrate the invention without unduly limiting the same.

EXAMPLE 1

Three steel specimens were IVD deposited with zinc plated aluminum wire feedstock in the manner of the present invention (hereinafter referred to as the co-deposition method) having nominal relative weight ratio of 5% zinc and 95% aluminum. Six specimens were IVD deposited by the independent boat method by essentially the same method except that the other speciment were IVD deposited by having aluminum and the other alloying elements in the independent boats. As can be seen from the data below, the codeposition method provided a much greater degree of composition control. See table 1. The independent boat method was tried with shields and without shields. The steel specimens were 1018 carbon steel test panels 5×5½ inches in size. The precise calibrations, i.e., temperature and pressure and other detailed conditions of the respective IVD Test were as follows:

A potential difference of approximately 1200 volts was applied between the evaporation source and the piece to be coated. The chamber was evacuated and then backfilled to $10^{-3}$ torr pressure with purified argon gas. The part to be coated was subjected to the cleaning action of the argon plasma for approximately 10 minutes before the temperature of the Al/Zn source was raised to the evaporation temperature.

TABLE 1

| PROCESS | | WEIGHT % NOMINAL COMOSITION | | | | WEIGHT % ACTUAL COMPOSITION | | | | % VARIANCE IN ZINC CONTENT |
|---|---|---|---|---|---|---|---|---|---|---|
| | | Al | Zn | In | Sn | Al | Zn | In | Sn | |
| INDEPENDENT BOAT | | 95 | 5 | | | 92.2 | 7.8 | | | +56% |
| METHOD | | 94.8 | 5 | 0.1–0.2 | | 87.0 | 11.9 | 1.1 | | +138% } +117% |
| WITH SHIELDS | | 94.8 | 5 | | 0.1–0.2 | 83.1 | 12.9 | | 4.0 | +158% AVG. |
| WITHOUT SHIELDS | | 95 | 5 | | | 86.6 | 13.4 | | | +168% |
| | | 94.8 | 5 | 0.1–0.2 | | 83.6 | 16.4 | | | +228% } +243% |
| | | 94.8 | 5 | | 0.1–0.2 | 78.1 | 21.7 | | 0.2 | +334% AVG. |
| PLATED WIRE | (1) | 95 | 5 | | | 90.1 | 9.9 | | | — |
| CO DEPOSITION | (2) | 95 | 5 | | | 96.5 | 3.5 | | | −30% |
| METHOD | (2) | 95 | 5 | | | 95.4 | 4.6 | | | −8% } −19% AVG. |

(1) BULK COMPOSITION OF PLATED WIRE (95/5 CALCULATIONS WERE BASED UPON RELATIVE AREAS IN A WIRE CROSS SECTION, NOT ON WEIGHT %. THIS ACCOUNTS FOR THE DESCREPANCY BETWEEN NOMINAL AND ACTUAL WT/O FOR THE PLATED WIRE)
(2) BULK COMPOSITION OF DEPOSITED COATING

EXAMPLE 2

Specimens from Example 1 were compared with regard to the IVD chamber modifications needed and as shown below in Table 3 the co-deposition methods of the present invention required no chamber modifications, yet obtained higher overall coating efficiency, and superior control over the coating composition.

TABLE 2

| PROCESS | CHAMBER MODIFICATION REQUIRED | OVERALL COATING EFFICIENCY | CONTROL OF COATING COMPOSITION (EST. LIMITS) | ZINC TRANSFER EFFICIENCY |
| --- | --- | --- | --- | --- |
| 1. INDEPENDENT EVAPORATION BOATS WITH SHIELDS | YES | LOW | POOR (±200%) | NOT MEASURED |
| 2. INDEPENDENT EVAPORATION BOATS WITHOUT SHIELDS | YES | HIGH | VERY POOR (±350%) | NOT MEASURED |
| 3. PLATED WIRE CO DEPOSITION | NO | HIGH | ACCEPTABLE (±20%) | LOW BUT ACCETABLE |

EXAMPLE 3

The following example was conducted with the independent boat method. The initial specimen batch thicknesses vary from 0.126 to 0.441 mils. Five alloyed coatings of different compositions were produced by the method. All coatings were deposited on 1018 carbon steel atmospheric test panels 5 inches × 5½ inches in size. A pair of ½ inch × 2 inch steel strips were included in each run for purposes of coating characterization and analysis. The average coating thickness, composition, and a relative performance rating for each coating are produced below in Table 4. As can be seen in this example the most effective sample contains 4% tin and this was an improvment over compositions having no tin or lesser amounts of tin. These test were continued for about 6 months.

TABLE 3

| FIG. # | BATCH # | AVG. THICKNESS (MILS) | COMPOSITION (WEIGHT %) | | | | PERFORMANCE RANKING* |
| --- | --- | --- | --- | --- | --- | --- | --- |
| | | | Al | Zn | In | Sn | |
| 8 | 8611 | .358 | 92 | 8 | | | 3 |
| 6 | 8612 | .272 | 87 | 12 | 1 | | 2 |
| 5 | 8614 | .205 | 97.5 | 1 | 1.5 | | — |
| 7 | 8615 | .208 | 83 | 13 | | 4 | 1 |
| 4 | 8616 | .199 | 95 | 1.5 | | 3.5 | 4 |
| 3 | 8617 | .176 | 100 | | | | 4 |

*1 = most effective, 4 = least effective

What is claimed is:

1. An improved method for electrochemical activation of IVD aluminum coatings comprising,
   a. providing an effective amount of zinc-plated aluminum wire;
   b. feeding said plated aluminum wire into the boats within the working chamber of an IVD machine;
   c. ion vapor depositing the zinc plated aluminum wire onto steel substrates at a temperature below the melting point of the zinc;
   whereby controlled sacrificial galvanic protection of the steel is achieved when exposed to mild atmospheres without formation of a passive oxide film.

2. The method of claim 1 wherein the zinc-plated aluminum wire contains tin.

3. An improved method for electrochemical activation of IVD aluminum coatings comprising,
   a. providing an effective amount of magnesium-plated aluminum wire;
   b. feeding said wire into the boats within the working chamber of an IVD machine;
   c. ion vapor depositing of the wire onto steel substrates at a temperature below the melting point of the magnesium;
   whereby controlled sacrifical galvanic protection of the steel is achieved when exposed to mild atmosphere, without formation of a passive oxide coating.

4. An improved method for electrochemical activation of IVD magnesium coatings comprising,
   a. providing an effective amount of magnesium wire;
   b. feeding said wire into the boats into the working chamber of an IVD machine;
   c. ion vapor depositing of the wire onto aluminum substrates;
   whereby controlled sacrificial galvanic protection of the aluminum is achieved when exposed to mild atmospheres, without formation of a passive oxide film.

* * * * *